United States Patent
Park et al.

(10) Patent No.: US 7,342,211 B2
(45) Date of Patent: Mar. 11, 2008

(54) IMAGE SENSOR AND METHOD OF MANUFACTURING THE SAME

(75) Inventors: Byung-Jun Park, Gyeonggi-do (KR); Yun-Hee Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 94 days.

(21) Appl. No.: 11/333,981

(22) Filed: Jan. 18, 2006

(65) Prior Publication Data

US 2007/0029463 A1 Feb. 8, 2007

(30) Foreign Application Priority Data

Aug. 5, 2005 (KR) .................. 10-2005-0071687

(51) Int. Cl.
*H01L 27/00* (2006.01)
*H01L 31/00* (2006.01)
*H01L 31/062* (2006.01)
*H01L 21/00* (2006.01)
*H04N 3/14* (2006.01)

(52) U.S. Cl. ................. 250/208.1; 250/214.1; 257/290; 257/291; 438/48; 348/294; 348/309

(58) Field of Classification Search ............ 250/208.1, 250/214.1, 214 R; 257/290, 291, 440, 446, 257/292; 438/48, 197; 348/294, 309
See application file for complete search history.

(56) References Cited

U.S. PATENT DOCUMENTS

2003/0234432 A1* 12/2003 Song et al. ............... 257/440

2006/0054945 A1* 3/2006 Mouli ...................... 257/290

FOREIGN PATENT DOCUMENTS

| JP | 2003-282856 | | 10/2003 |
| JP | 2005-183920 | A | 7/2005 |
| KR | 1020020017794 | A | 3/2002 |
| KR | 1020040008050 | A | 1/2004 |
| KR | 1020050029431 | A | 3/2005 |

OTHER PUBLICATIONS

Notice of Office Action issued by the Korean Patent Office for 9-5-2006-058079809; dated Sep. 30, 2006.

* cited by examiner

*Primary Examiner*—Georgia Epps
*Assistant Examiner*—Don Williams
(74) *Attorney, Agent, or Firm*—Myers Bigel Sibley & Sajovec PA

(57) ABSTRACT

Dark current caused by a crystalline defect in an interfacial surface of a device isolating layer is prevented according to an image sensor and a method of manufacturing the same. A first device isolating layer adjacent to a photodiode disposed on an upper surface of a semiconductor substrate protrudes from the semiconductor substrate. A side surface of the first device isolating layer is covered by a first spacer with a refractivity greater than that of the first device isolating layer. The photodiode is insulated by the device isolating layer protruding from the semiconductor substrate to prevent the dark current. By forming the spacer on the sidewall of the device isolating layer to attain total reflection, efficiency of light incident to the photodiode is improved.

13 Claims, 11 Drawing Sheets

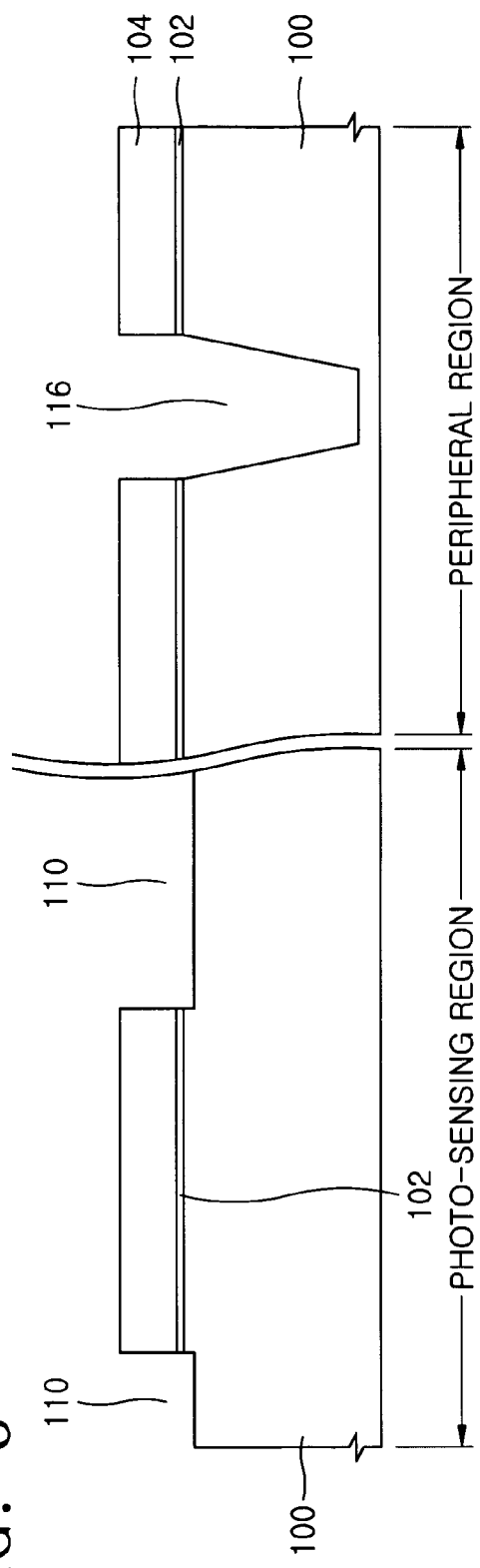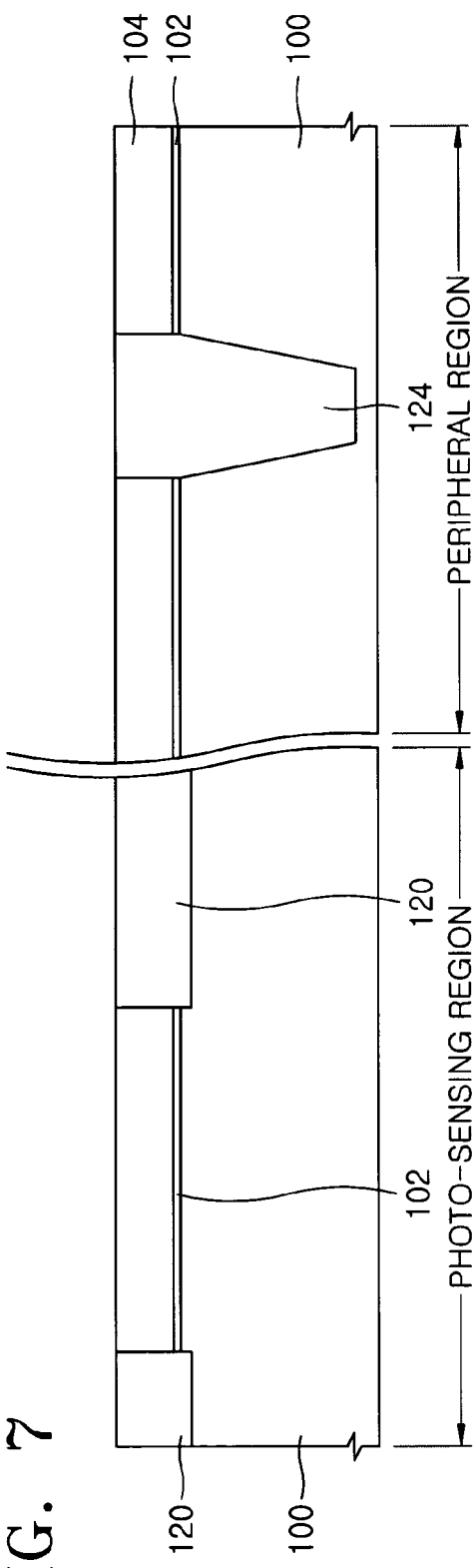

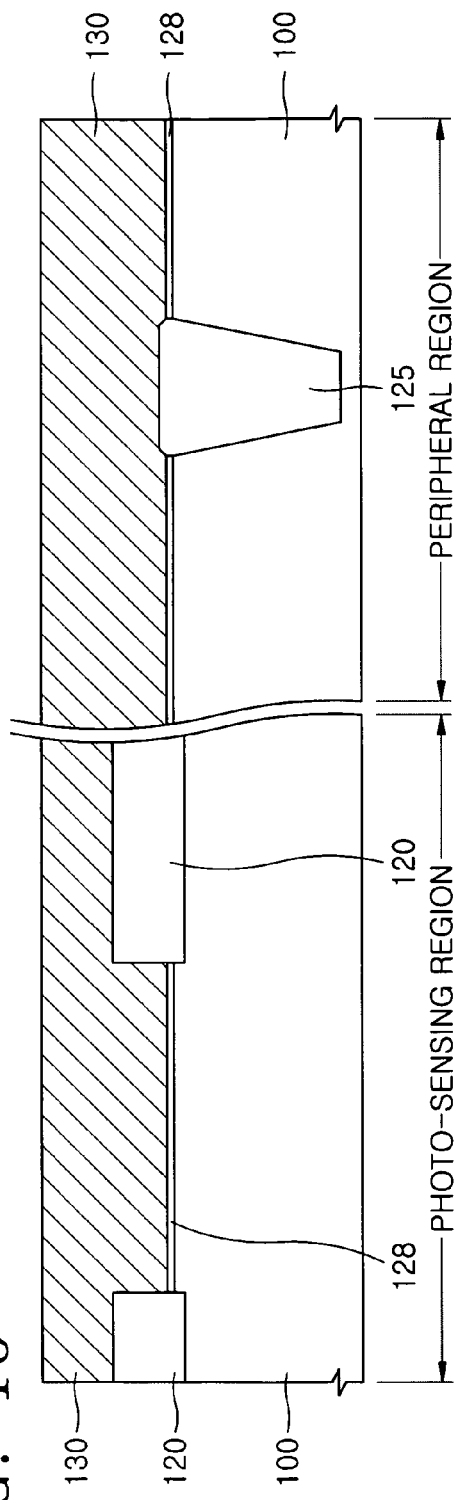
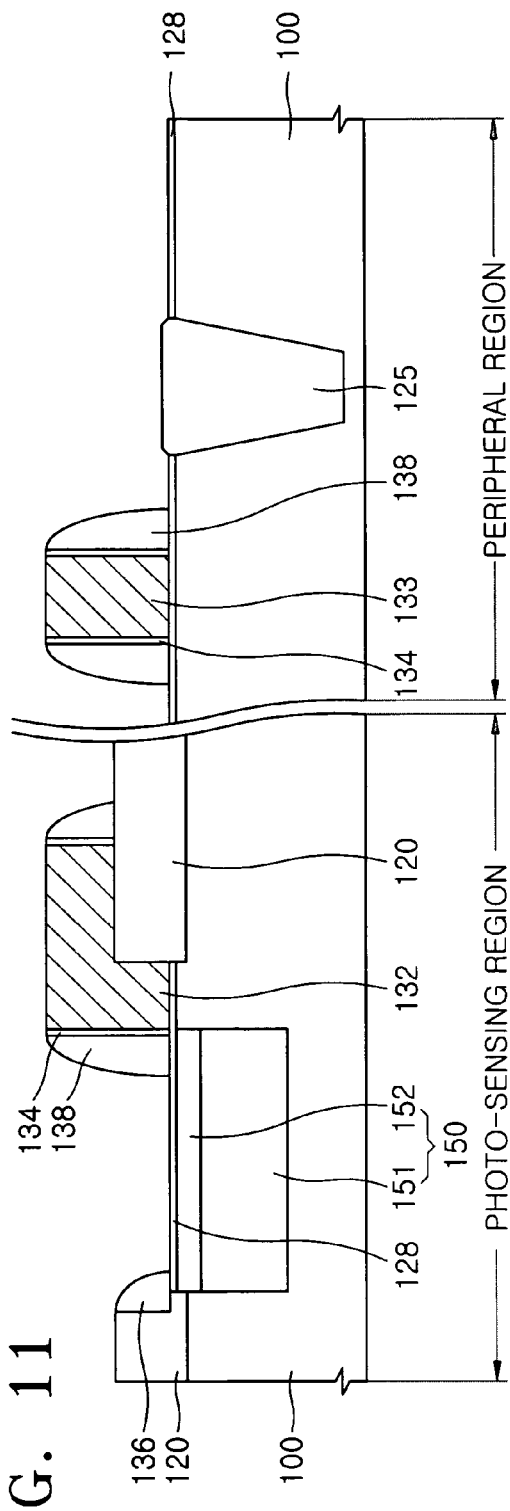

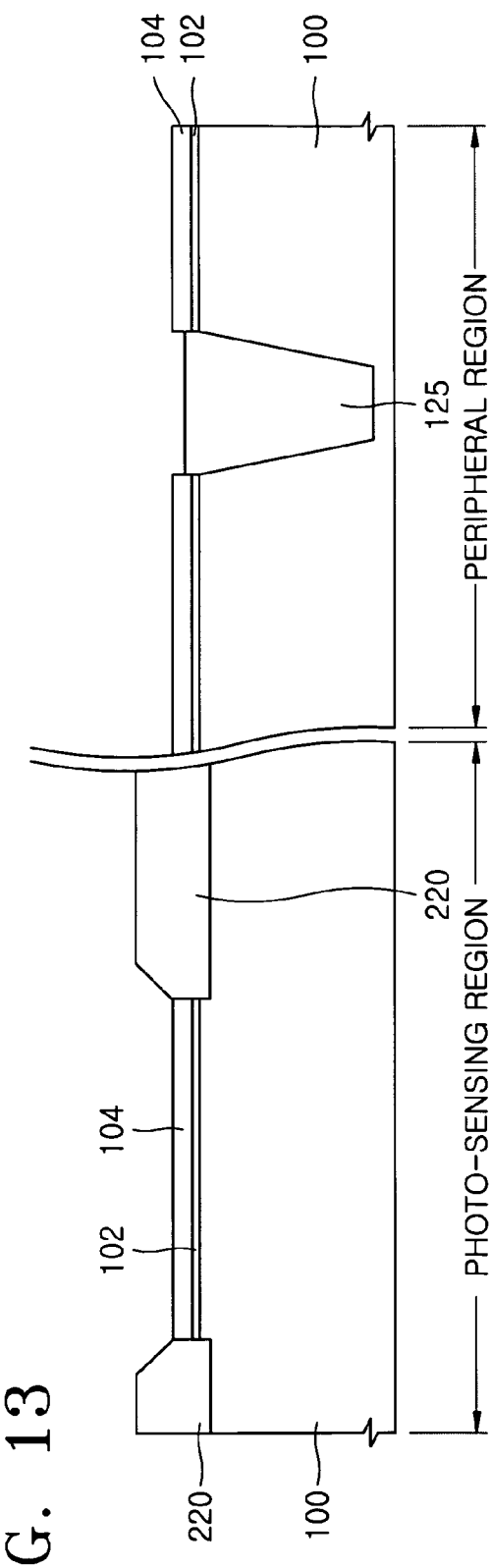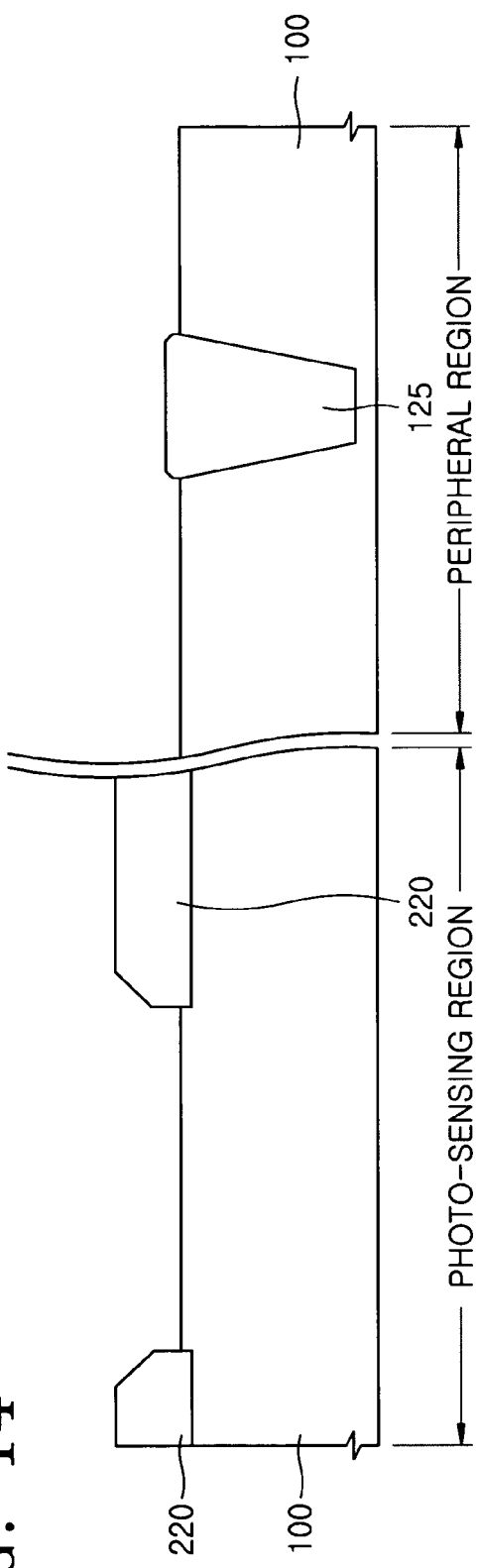

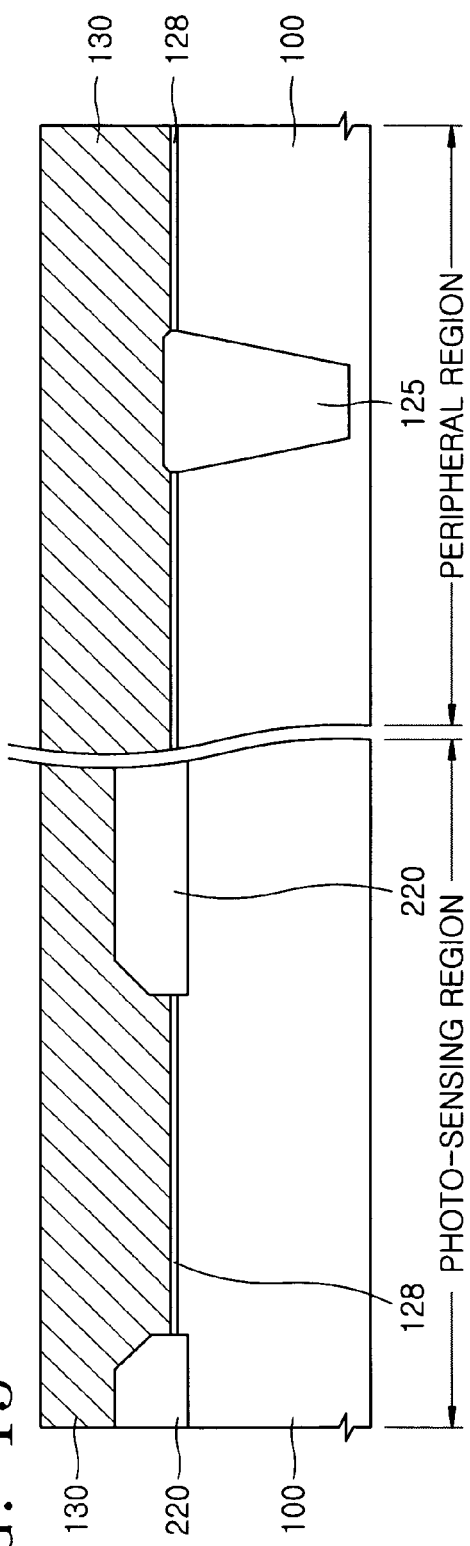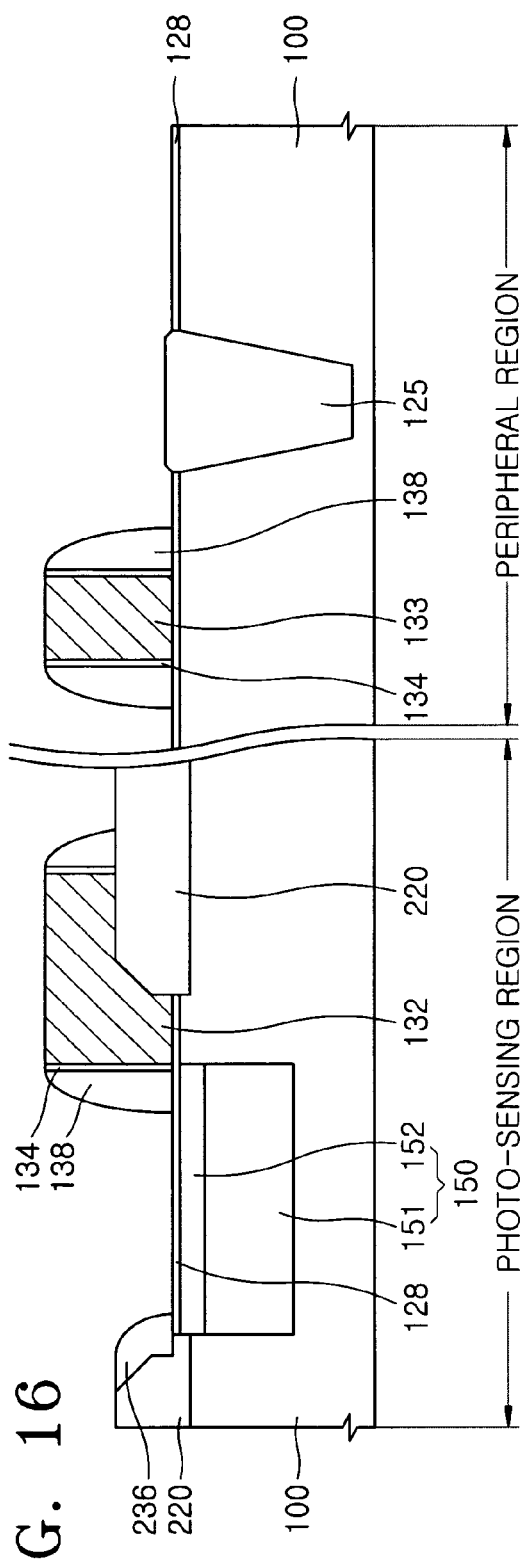

IMAGE SENSOR AND METHOD OF MANUFACTURING THE SAME

REFERENCE TO PRIORITY APPLICATION

This application priority to Korean Patent Application No. 10-2005-0071687, filed Aug. 5, 2005, in the Korean Intellectual Property Office, the disclosure of which is hereby incorporated herein by reference.

FIELD OF THE INVENTION

The present invention relates to image sensors and methods of forming image sensors in integrated circuit substrates.

BACKGROUND OF THE INVENTION

Photodiodes are light receiving elements that convert optical signals into electrical signals. Photodiodes are widely available in optical communication and optical pick-up devices such as CD-ROMs and DVDs. When light is incident onto a photodiode, electron-hole pairs are produced in a depletion region. The electron-hole pairs are transferred via an externally connected gate or an interconnect line. The current within a photodiode is varied substantially in accordance with an optical generation rate of carriers, and operates to convert the temporally varied optical signal to an electrical signal.

An image sensor with a photodiode (e.g., a CMOS image sensor (CIS)), includes a photo-sensing region and a periphery region. In the photo-sensing region, a plurality of unit pixels is arranged. The unit pixel has a single photodiode and a plurality of gates. The plurality of gates transmit the current generated from the photodiode to the periphery region. Then, the periphery region converts the current transferred from the photo-sensing region to digital signals using a plurality of circuits, thereby obtaining image information.

A device isolating layer is formed to separate a predetermined portion of the photodiode and circuits of the periphery circuit region from surrounding regions. The circuits of the periphery region are fabricated via a CMOS process, causing no problem in the device isolation. However, a device isolating layer around the photodiode may incite a dark current due to crystalline defects at an interfacial surface.

FIG. 1 is a sectional view illustrating a periphery of a photodiode including a device isolating layer in a conventional image sensor. Referring to FIG. 1, the image sensor includes a photodiode 20 formed on a semiconductor substrate 10, and separated by a device isolating layer 16. The semiconductor substrate 10 includes a first p-well 12 doped at a high density and a second p-well 14 doped at a relatively low density. The photodiode 20 generally has a p-type photodiode region 21 and an n-type photodiode region 22. A transfer gate 26, which is formed on a gate insulating layer 24, transfers optical charge generated from the photodiode 20 to a floating diffusion node 28.

The device isolating layer 16 is an insulating layer that inhibits overflow or signal interference between adjacent photodiodes 20, using STI or LOCOS. However, when forming the device isolating layer 16, crystalline defects may occur in an interfacial surface between the device isolating layer 16 and the first well 14. The crystalline defect functions as a noise component of a unit pixel and may increase dark current, which may damage picture quality of the image sensor.

SUMMARY OF THE INVENTION

Embodiments of the present invention include image sensors having high degrees of photon collection efficiency. According to some of these embodiments, an image sensor includes a semiconductor substrate having a photodiode therein. The photodiode, which includes a semiconductor region of first conductivity type (N-type or P-type) extending to a first portion of a surface of the semiconductor substrate, is configured to receive light incident thereon. A first device isolating layer is also provided. This first device isolating layer has a sidewall extending adjacent the first portion of the surface of the semiconductor substrate. A first electrically insulating spacer is provided, which extends on the sidewall of the first device isolating layer. In order to increase photon collection efficiency, the first electrically insulating spacer includes a material having a greater refractivity than the first device isolating layer. According to further aspects of these embodiments, an electrically insulating reflection inhibiting layer covers the first electrically insulating spacer and the first portion of the surface of the semiconductor substrate. The reflection inhibiting layer includes a material having a lower refractivity than the first electrically insulating spacer. A charge transfer electrode (of a transfer transistor) extends adjacent the first portion of the surface of the semiconductor substrate. This charge transfer electrode extends onto an upper surface of the first device isolating layer and has a sidewall extending adjacent the first portion of the surface of the semiconductor substrate. A second electrically insulating spacer is provided. The second electrically insulating spacer extends on the sidewall of the charge transfer electrode. This second electrically insulating spacer includes a material having a greater refractivity that the first device isolating layer. The first and second electrically insulating spacers may include a nitride material.

Still further embodiments of the present invention include methods of forming image sensors. These methods include forming a first device isolating layer having an opening therein that exposes a first portion of a surface of a semiconductor substrate and then filling the opening with an electrically conductive layer. A step is then performed to selectively etch the electrically conductive layer to define a transfer gate electrode within a portion of the opening. A photodiode is also formed in the semiconductor substrate by implanting dopants into the first portion of the surface of the semiconductor substrate, using the transfer gate electrode as an implant mask.

According to some of these embodiments, the step of selectively etching the electrically conductive layer is followed by a step of forming an electrically insulating spacer on a sidewall of the transfer gate electrode. A refractivity of the electrically insulating spacer is greater than a refractivity of the first device isolating layer. The step of selectively etching the electrically conductive layer may be followed by a step of forming an electrically insulating reflection inhibiting layer covering the spacer and the first portion of the surface of the semiconductor substrate. This electrically insulating reflection inhibiting layer has a lower reflectivity relative to the spacer. According to aspects of these embodiments, the step of selectively etching the electrically conductive layer includes etching a sidewall recess in the first device isolating layer. The step of forming an electrically insulating spacer on a sidewall of the transfer gate electrode includes forming a second electrically insulating spacer in the sidewall recess. This step of selectively etching the electrically conductive layer may be followed by a step of forming an electrically insulating reflection inhibiting layer covering the spacer and the first portion of the surface of the semiconductor substrate.

An image sensor according to additional embodiments of the invention includes a photodiode adjacent an upper surface of a semiconductor substrate, and a first device isolating layer adjacent to the photodiode.

In some embodiments, an upper surface of the first device isolating layer may be slanted. A side surface of the first device isolating layer is covered with a first spacer. A refractivity of the first spacer may be greater than that of the first device isolating layer. The first device isolating layer may be composed of oxide, and the first spacer is composed of nitride.

The image sensor further includes a first insulating layer that covers an entire surface of the semiconductor substrate having the first device isolating layer. Furthermore, a photo blocking layer, which is patterned on the first insulating layer allows light to be incident to the photodiode, and a planarization layer covers the photo blocking layer pattern and the first insulating layer. A refractivity of the first insulating layer may be smaller than that of the first spacer. Also, the first insulating layer is composed of oxide, and the first spacer is composed of nitride. Additionally, at least one reflection preventing layer may be formed between the first insulating layer and the semiconductor substrate. The refractivity of the lowermost layer of the reflection preventing layer is smaller than that of the first spacer. Moreover, the lowermost layer of the reflection preventing layer is composed of oxide, and the first device isolating layer is composed of nitride.

The image sensor may include transfer gate disposed on one side of the photodiode to transfer optical charge generated from the photodiode to a floating diffusion region. A second spacer may be disposed along a sidewall of the transfer gate by interposing a sidewall oxide layer. Also, the sidewall oxide layer is composed of oxide, and the second spacer is composed of nitride.

According to additional embodiments of the invention, there is provided a method of manufacturing an image sensor. After forming a mask pattern to define a first device isolating region on the semiconductor substrate, a first device isolating layer is formed by filling a buried material layer in the first device isolating region. Then, the mask pattern is removed to expose a photodiode region of the semiconductor substrate. A photodiode is formed in the exposed photodiode region.

The removing of the mask pattern includes partially removing the mask nitride layer as much as a uniform thickness using the first device isolating layer as an etch mask. After slanting an upper end of the first device isolating layer of the mask nitride layer side, the mask nitride layer and the pad oxide layer are removed to expose the semiconductor substrate. After forming the photodiode, a first spacer covering a side surface of the first device isolating layer may be formed, which has a refractivity greater than that of the first device isolating layer. Moreover, after forming the photodiode, a first insulating layer covering an entire surface of the semiconductor substrate is formed, has the first device isolating layer, and has refractivity smaller than that of the first spacer. Then, a photo blocking layer is formed on the first insulating layer to allow light to be incident to the photodiode. Additionally, a planarization layer covering the photo blocking layer pattern and the first insulating layer is formed. At least a single-layered reflection preventing layer may be formed to cover an entire surface of the semiconductor substrate having the first device isolating layer, and has a lowermost layer with a refractivity lower than that of the first spacer.

According to still another embodiments of the present invention, there is provided a method of manufacturing an image sensor to prepare a semiconductor substrate. Then, a mask pattern is formed to define a first device isolating region on the semiconductor substrate of a photo-sensing region having a photodiode, and a second device isolating region on the semiconductor substrate of a periphery region. After forming a trench region obtained by expanding the second device isolating region into the semiconductor substrate using the mask pattern as an etch mask, a first device isolating layer is formed by filling a buried material layer in the first device isolating layer, and simultaneously a second device isolating layer is formed to define an active region by filling in the trench region of the periphery region. Furthermore, a MOS gate is formed on the active region to electrically process the optical charge.

BRIEF DESCRIPTION OF THE DRAWINGS

FIGS. 3 through 12 are sectional views illustrating a method of manufacturing the image sensor according to the first embodiment of the present invention; and FIGS. 13 through 17 are sectional views illustrating a method of manufacturing the image sensor according to a second embodiment of the present invention.

DETAILED DESCRIPTION OF THE INVENTION

Figure 1:
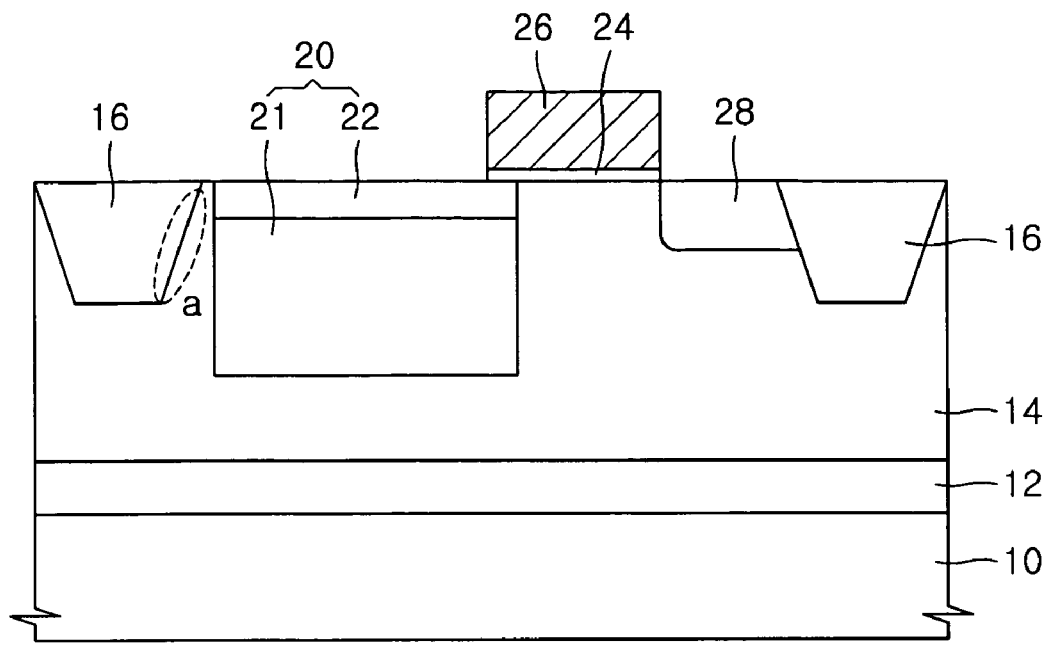
FIG. 1 is a sectional view illustrating a periphery of a conventional photodiode having a device isolating layer therein.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Embodiments of the present invention will be described by focusing on a device isolating layer of an image sensor. In more detail, a photodiode and an adjacent device isolating layer will be described. An image sensor stated hereinafter is partially selected for convenience of description. For example, a photodiode and an adjacent portion are selected in a photo-sensing region, and a portion having a MOS gate is selected in a periphery region. Also, the present invention will be described in a first embodiment and a second embodiment in accordance with a shape of the device isolating layer.

Figure 2A:
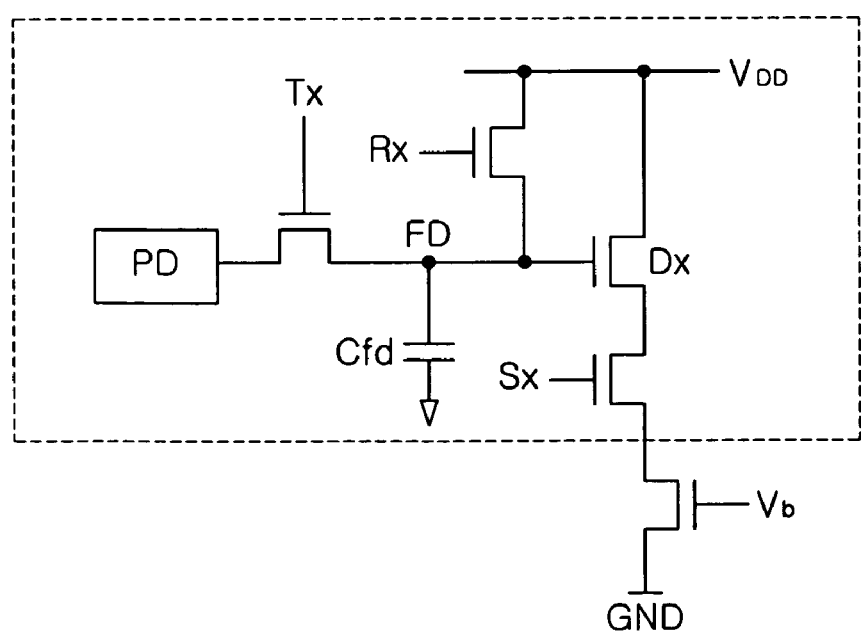
FIG. 2A is a circuit diagram illustrating a unit pixel of an image sensor according to an embodiment of the present invention.
Figure 2B:
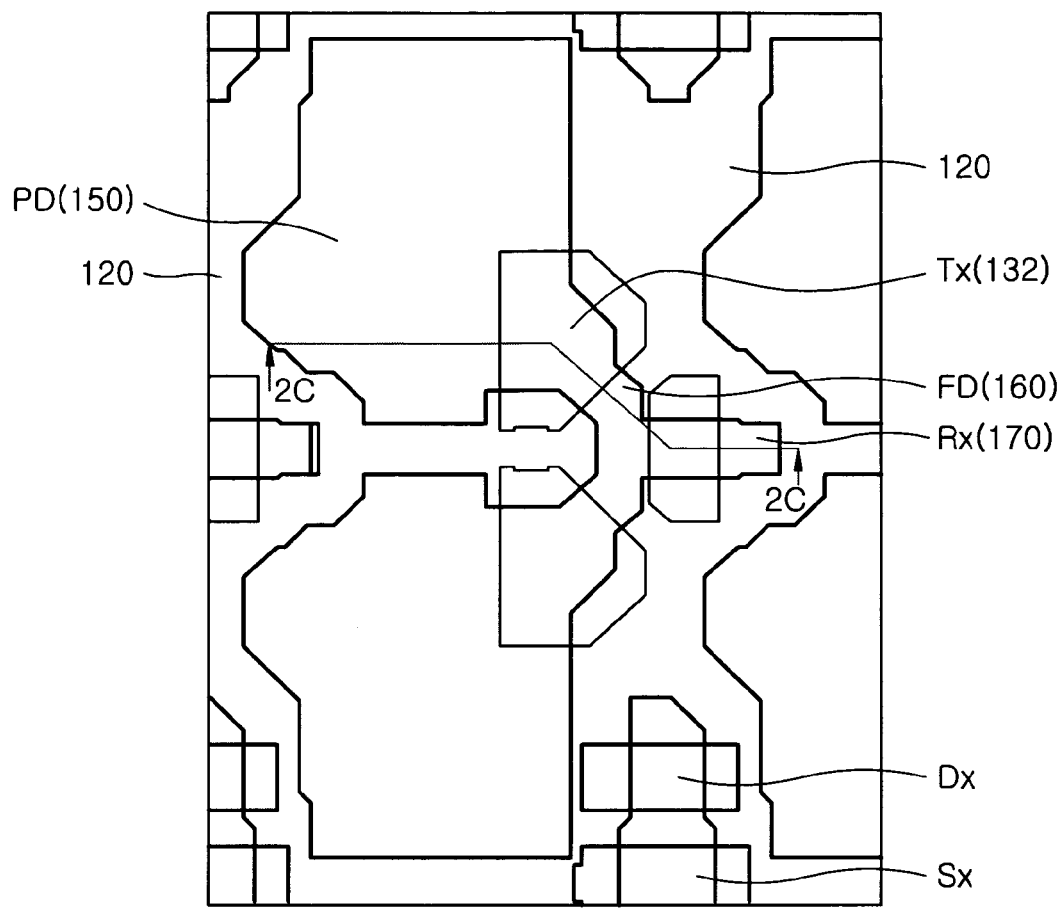
FIG. 2B is a plan view showing the unit pixel of FIG. 2A.
Figure 2C:
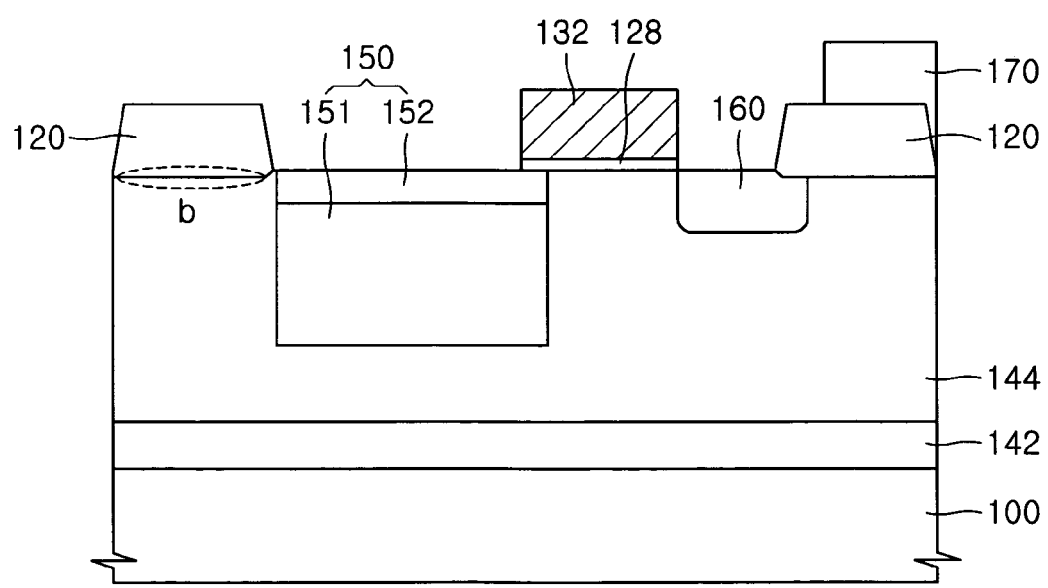
FIG. 2C is a sectional view of the unit pixel cut along a line 2C-2C of FIG. 2B.

FIG. 2A is a circuit diagram illustrating a unit pixel of the image sensor, and FIG. 2B is a plan view of the unit pixel of FIG. 2A. FIG. 2C is a sectional view cut along a line 2C-2C of FIG. 2B, in which a first device isolating layer 120 according to a first embodiment is employed. Referring to FIGS. 2A and 2B, the unit pixel of the image sensor includes a single photodiode PD and four NMOS gates. In this case, four NMOS gates are a transfer gate Tx 132 that transfers optical charge focused by the photodiode PD to a floating diffusion node FD, and a reset gate Rx 170 that sets a potential of the floating diffusion node FD and discharges the charge to reset the floating diffusion node FD. Additionally, a drive gate Dx acts as a source follower-buffer amplifier, and a select gate Sx allows for addressing by switching. A drain-source path, which is controlled by a load gate $V_b$, formed between a source of the select gate Sx and a ground GND reference potential.

Referring to FIG. 2C, the image sensor includes a photodiode 150 formed on a semiconductor substrate 100, and separated from adjacent photodiodes by a first device isolating layer 120. The semiconductor substrate 100 includes a first p-well 142 doped at a high density and a second p-well 144 doped at a relatively low density. The photodiode 150 generally has a p-type photodiode 151 and an n-type photodiode 152. A transfer gate 132, which is formed on a gate insulating layer 128, controls transfers of optical charge generated from the photodiode 150 to a floating diffusion node 160. The first device isolating layer 120 protrudes from the semiconductor substrate 100 on the periphery of the photodiode 150 and under a reset gate 170, as illustrated.

The interfacial surface between the first device isolating layer 120 and the second well 144 involves a negligible quantity of crystalline defects as compared against the conventional device isolating layer (16 of FIG. 1). That is, the decreased crystalline defect on the interfacial surface reduces dark current that may occur in a unit pixel. The crystalline defect occurring on the interfacial surface between the first device isolating layer 120 and the semiconductor substrate 100 is caused mainly by a dangling bond that is an imperfect bond of Si and O. Even if no light is incident, the dangling bond generates the electron because of an imperfect bond such as Si=O or Si=, thereby resulting in the dark current.

However, the first device isolating layer 120 according to the present invention has advantages over the conventional device isolating layer. First, the conventional device isolating layer (16 of FIG. 1) is buried in the semiconductor substrate 10, so that the interfacial surface involving the crystalline defect is relatively wider than the first device isolating layer 120. In other words, the first device isolating layer 120 has a lower probability of including crystalline defects. Furthermore, the conventional device isolating layer is closer to the photodiode region relative to the first device isolating layer 120. That is, the crystalline defect occurring in the conventional device isolating layer 16 of FIG. 1 can be made easily delivered to the photodiode.

Figure 3:
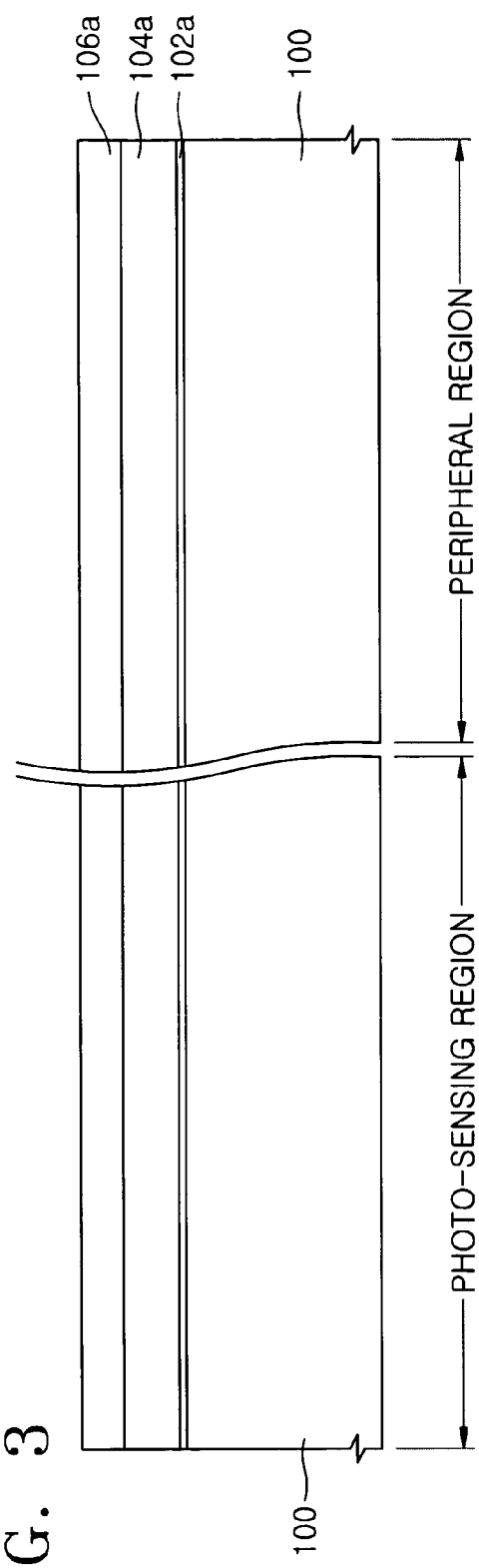

FIGS. 3 through 12 are sectional views illustrating a method of manufacturing the image sensor according to the first embodiment of the present invention. Referring to FIG. 3, a pad oxide material layer 102a, a mask nitride material layer 104a and a reflection prevention material layer 106a are subsequently formed on the semiconductor substrate 100, which includes a photo-sensing region and a peripheral circuit region. The pad oxide material layer 102a, which is formed to decrease a stress between the semiconductor substrate 100 and the mask nitride material layer 104a, has a thickness of 20~200 Å, and preferably about 100 Å. The mask nitride material layer 104a, which is used as a hard mask to form a trench region (116 of FIG. 5) in a subsequent process, is formed by depositing silicon nitride to a thickness of about 1,000~3,000 Å, and preferably 1,500~2,000 Å. The nitride deposition may be performed by Chemical Vapor Deposition (CVD), Sub-atmospheric CVD (SACVD), Low Pressure CVD (LPCVD) or Plasma Enhanced CVD (PECVD).

The reflection prevention material layer 106a is thinly formed on a lower surface of a photoresist pattern to decrease irregular reflection incited by an underlying layer during photolithography. The reflection prevention material layer 106a has a thickness of about 1,500 Å. The reflection prevention material layer 106a may be an SiON layer formed by PE-CVD using $SiH_4$ and $NH_3$ as source gases.

As described with reference to FIG. 2C, the highly doped first p-well 142 and the second p-well 144 at a relatively low density may be formed in the semiconductor substrate 100. In this case, the present invention will be described by focusing on the photodiode region within the photo-sensing region, and the MOS gate in the peripheral region.

Figure 4:
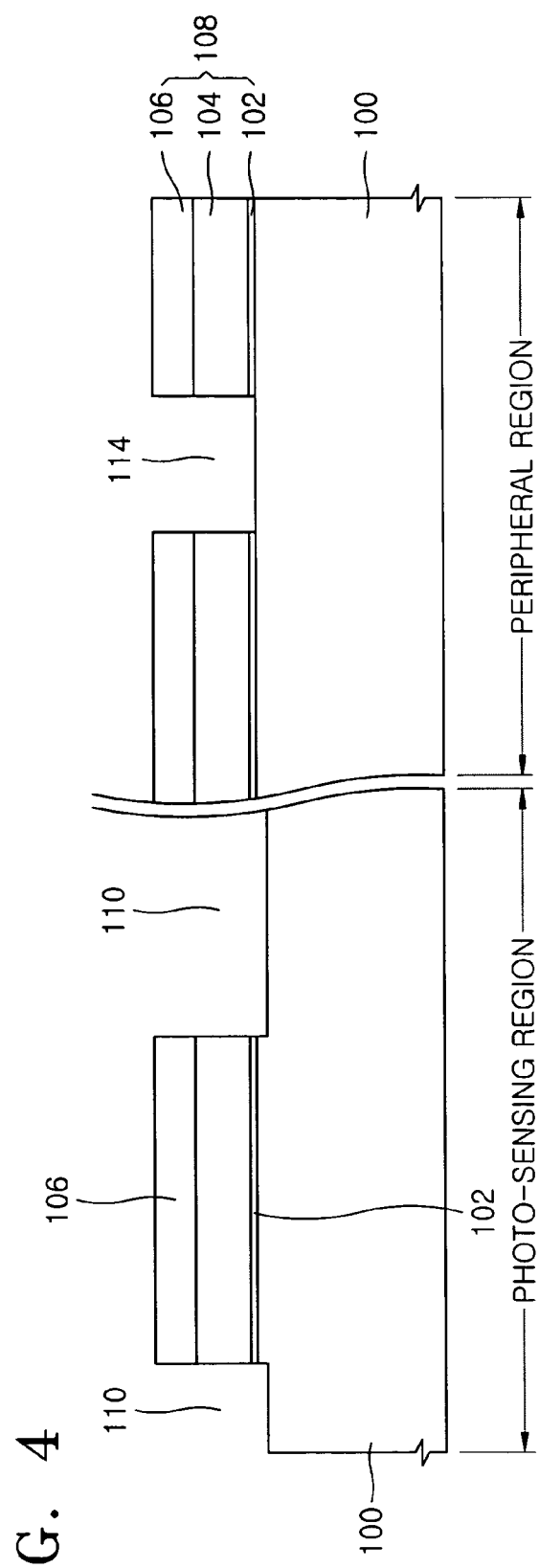

Referring to FIG. 4, a device isolating layer (hereinafter referred to as a "first device isolating layer") of the photo-sensing region is defined. Simultaneously, a first photoresist pattern (not shown) to define a device isolating layer (hereinafter referred to as a "second device isolating layer") of the peripheral circuit region is formed. Then, the first photoresist pattern is used as an etch mask to remove portions of the reflection preventing material layer 106a, the mask nitride material layer 104a, and the pad oxide material layer 102a using anisotropic dry etching, thereby forming a mask pattern consisting of a patterned reflection preventing layer 106, a mask nitride layer 104, and a pad oxide layer 102. At this time, the first device isolating layer region 110 is formed in the photo-sensing region, and the second device isolating layer region 114 is formed in the peripheral region. As illustrated, an exposed portion of the semiconductor substrate 100 is slightly recessed due to an influence of the anisotropic dry etching.

Figure 5:
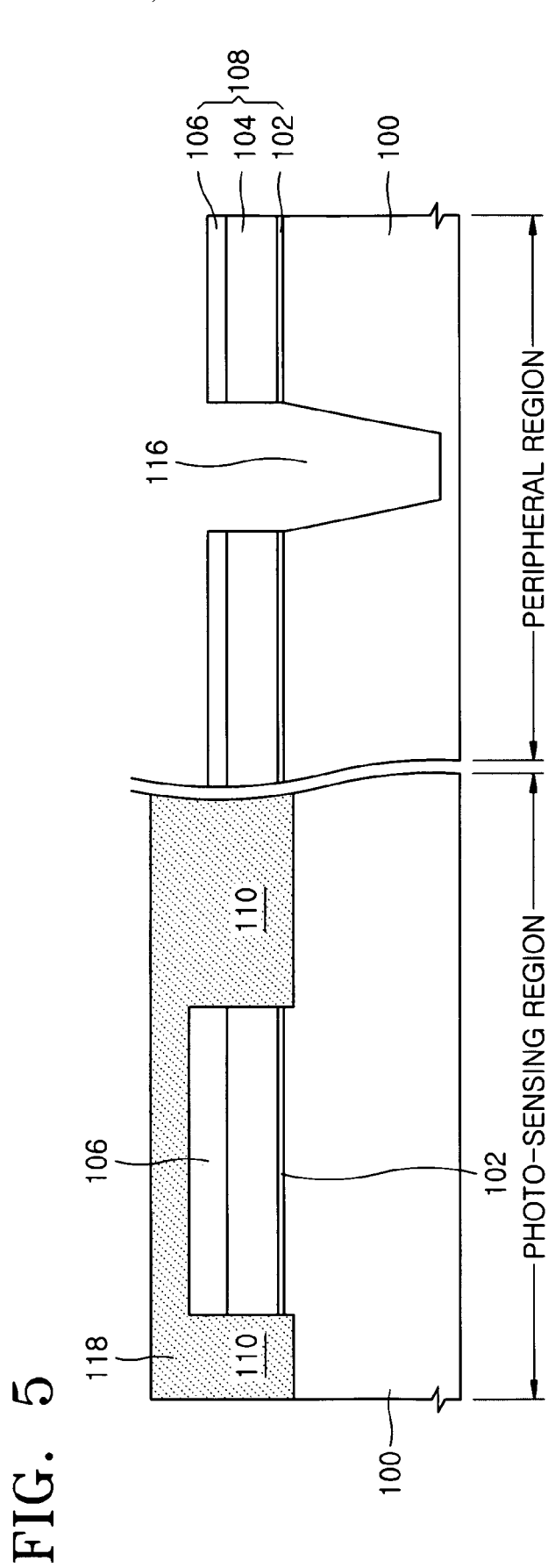

Referring to FIG. 5, a second photoresist pattern 118, which exposes the peripheral region, is formed. Thereafter, using the second photoresist pattern 118 and the mask pattern 108 as etch masks, the trench region 116, obtained by deepening the second device isolating region 114, is formed. Then, the second photoresist pattern 118 is subjected to ashing using a typical method (e.g., oxygen plasma), and is removed by organic stripping. In this case, the trench region 116 is deep enough to perform device isolation. A sidewall oxide layer (not shown) is formed on the entire surface of the trench region 116. The sidewall oxide layer is formed on an inner sidewall and a bottom surface of the trench region 116 to cure damage produced when etching to form the trench region 116. The sidewall oxide layer, which is formed of thermal oxide or CVD oxide, may have a thickness of about 20~200 Å.

Referring to FIG. 6, after the second photoresist pattern 118 is removed using the typical method (e.g., ashing), the reflection preventing layer 106 is removed using isotropic etching. In this case, the isotropic etching may be performed by wet etching using HF, $H_2O_2$, and deionized water mixed in a ratio of about 1:70:30, or dry etching using a fluorine (F)-based etchant added with $O_2$, CO and Ar gas. Wet etching is preferable.

Referring to FIG. 7, surfaces of the first device isolating region 110 and the trench region 116 are cleaned. Then, the trench region 116 is filled with a buried insulating material layer 124. The buried material layer 124 may be an insulating layer composed of a material selected from a group consisting of USG, HDP oxide, TEOS using PECVD, oxide using PECVD, and a combination of these. Among these materials, an HDP (i.e., high density plasma) oxide layer with a dense film quality may be suitable for filling the trench region 116. In case of the HDP, deposition may be performed by combining CVD and etching by sputtering. Thus, not only is a deposition gas used to deposit a material layer, which is supplied to the inside of a chamber, a sputtering gas is used to etch the deposited material layer. For example, $SiH_4$ and $O_2$ may be supplied into the chamber as deposition gases, and an inert gas (e.g., Ar gas) may be supplied into the chamber as a sputtering gas. The supplied deposition gas and the sputtering gas may be partially ionized using plasma within the chamber incited by a high frequency electric power. Because a biased high frequency electric power is supplied to a wafer chuck (e.g., electrostatic chuck) within the chamber mounted with a substrate, the ionized deposition gas and the sputtering gas are accelerated to the surface of the substrate. The accelerated deposition gas ions form the silicon oxide layer, and the accelerated sputtering gas ion sputters the deposited silicon oxide layer. By doing so, the HDP oxide layer has a dense film quality and an excellent gap fill characteristic.

Subsequently, the trench region 116, which is filled with the buried material layer 124, is planarized, and is substantially level with an upper surface of the mask nitride layer 104. Planarization may be performed using Chemical mechanical Polishing (CMP) or etch-back. When performing the planarization, the mask nitride layer 104 may be used as a planarization stop layer. A slurry used for the CMP may etch the buried material layer 124 (e.g., the HDP oxide layer) faster than the mask nitride layer 104. A slurry such as a ceria-based polishing material may be employed. Simultaneously, the first device isolating layer 120 is formed by filling the isolating region 110 with an insulator that is planarized using CMP.

Figure 8:
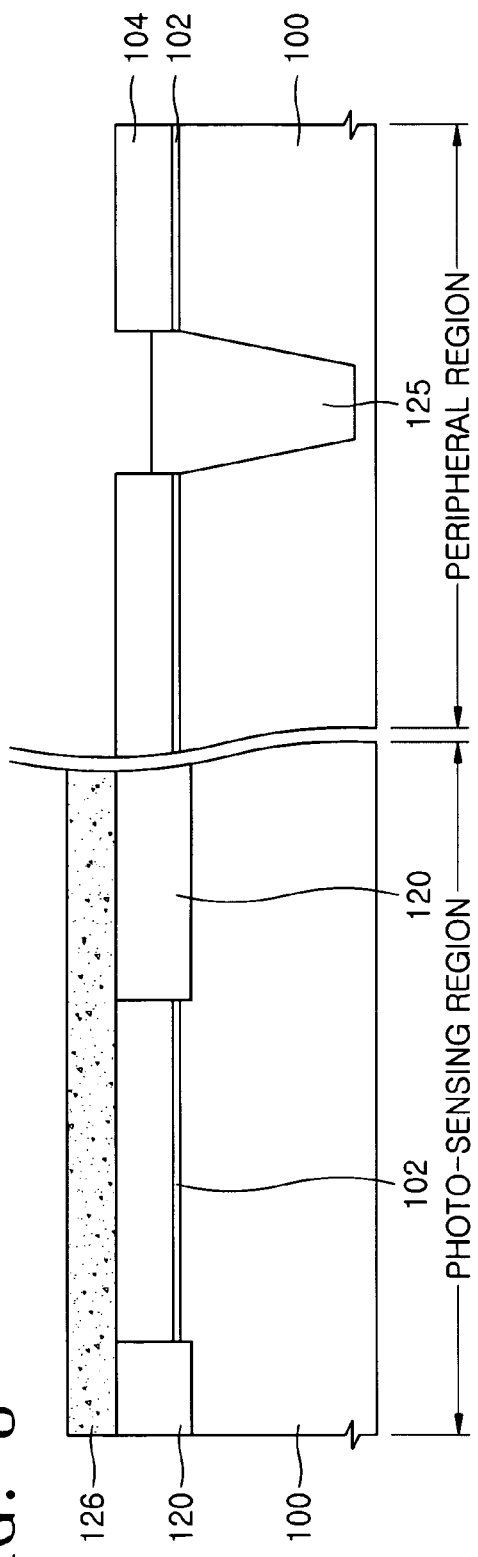

Referring to FIG. 8, a third photoresist pattern 126 covering the photo-sensing region is formed to expose the periphery region. Then, using the third photoresist pattern 126 and the mask nitride layer 104 as etch masks, an upper surface of the buried material layer 124 is partially removed to form the second device isolating layer 125. The buried material layer 124 may be partially removed using diluted HF, $NH_4F$, or a Buffered Oxide Etchant (BOE) that is a mixture of HF and deionized water. The buried material layer 124 is partially removed to lower the step height of the second device isolating layer 125. Preferably, the second device isolating layer 125 protrudes from the semiconductor substrate 100 as much as a predetermined height for the device isolation.

Figure 9:
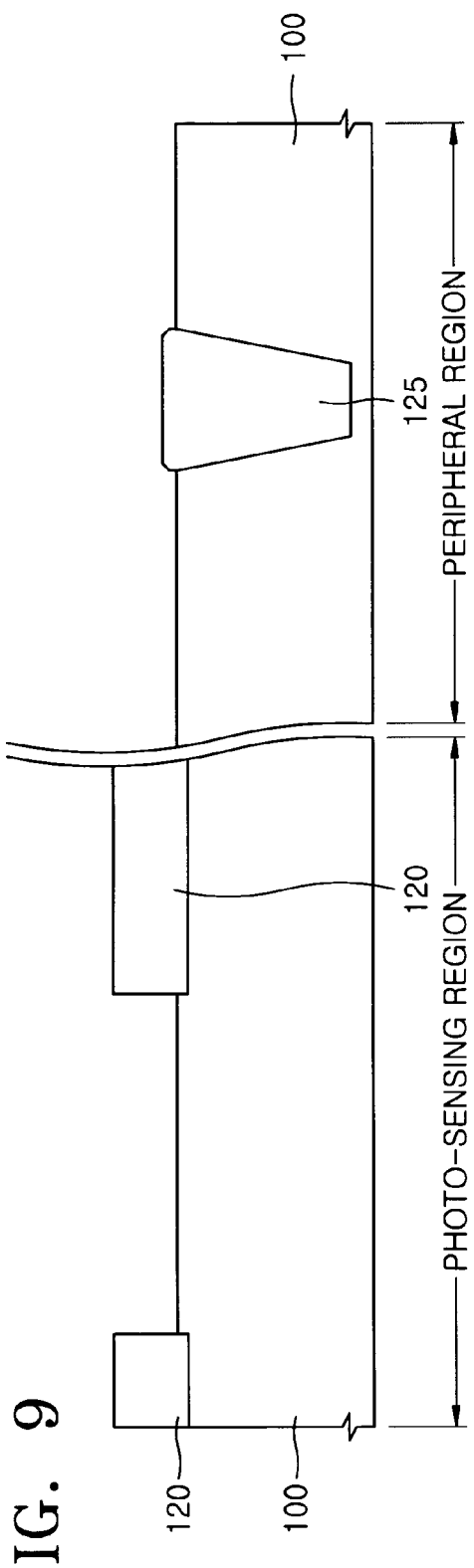

Referring to FIG. 9, the mask nitride layer 104 is removed using an etchant such as $H_3PO_4$ and the pad oxide layer 102 is removed using diluted HF, $NH_4F$, or a Buffered Oxide Etchant (BOE) that is a mixture of HF and deionized water. By doing so, the semiconductor substrate 100 where the photodiode will be formed is exposed in the photo-sensing region, and the semiconductor substrate 100 where the MOS gate will be formed is exposed in the periphery region.

Referring to FIG. 10, a gate insulating layer 128 is formed on the semiconductor substrate 100 between the first and second device isolating layers 120 and 125. The gate insulating layer 128 may be a thermal oxide layer and an insulating layer with a high dielectric constant (e.g., either a CVD oxide layer or an ONO layer). Thereafter, the gate insulating layer 128, and a gate electrode material layer 130 covering the first and second device isolating layers 120 and 125 are formed. The gate electrode material layer 130 may be a single layer composed of a material selected from a group consisting of amorphous polysilicon, doped polysilicon, poly-SiGe, and a conductive metal, or a composite layer of these materials. The conductive metal containing material may be selected from a group consisting of a metal such as tungsten or molybdenum, and a conductive metal nitride such as titanium nitride, tantalum nitride or tungsten nitride.

Referring to FIG. 11, a fourth photoresist pattern (not shown) to define gates is formed. Then, using the fourth photoresist pattern as an etch mask, the gate electrode material layer 130 is removed via anisotropic dry etching to form the gates. For the convenience of description, the transfer gate 132 and a MOS gate 133 of the periphery region are illustrated. In some cases, a thin thermal oxide layer 134 may be formed along sidewalls of the gates 132 and 133. During forming the gates, the sidewall of the first device isolating layer 120 may be partially removed.

Subsequently, the photodiode 150 is formed in the semiconductor substrate 100 between the gates (e.g., the transfer gate 132 and the first device isolating layer 120) of the photo-sensing region. The photodiode 150 includes a p-type photodiode region 151 and an n-type photodiode region 152. Thereafter, a first spacer 136 is formed along the sidewall of the first device isolating layer 120 contacting with the photodiode 150, and a second spacer 138 is formed on the entire surface of the transfer gate 132 and the thermal oxide layer 134 is disposed along the sidewall of the MOS gate 133 of the periphery region. In this case, refractivities of the first and second spacers 136 and 138 may be greater than the refractivity of the first device isolating layer 120, respectively.

Figure 12:
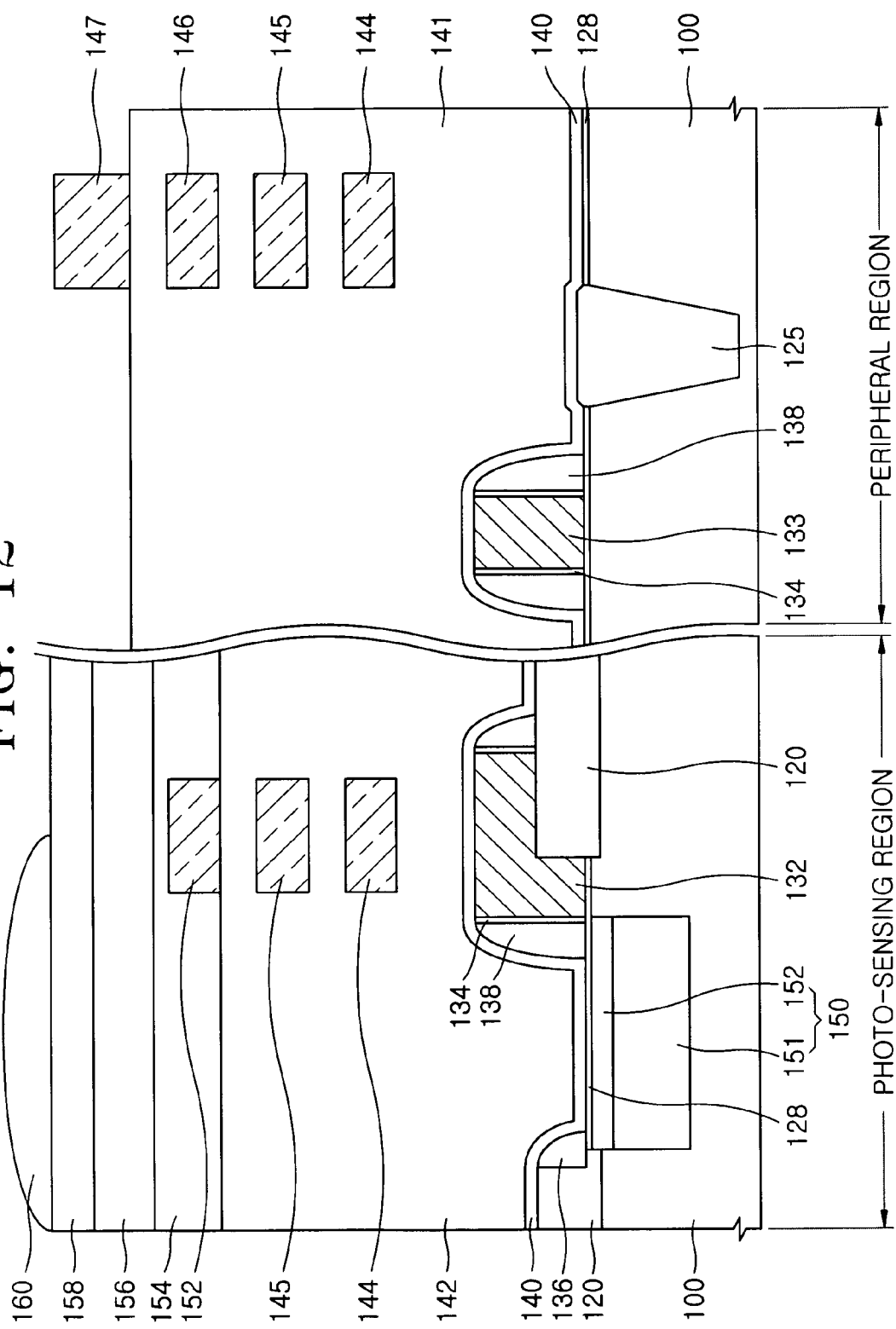

Referring to FIG. 12, a reflection preventing layer 140 is formed on the entire surface of the photo-sensing region formed with the gates and the periphery region. The reflection preventing layer 140 provides for increasing a quantity of received light by reducing the reflection of incident light. A reflection preventing layer may be obtained by stacking an insulating layer with a small refractivity and an insulating with a great refractivity to thereby significantly decrease a reflection rate. Therefore, the reflection preventing layer is at least double-layered by combining insulating layers with different refractivities.

Subsequently, a first insulating layer 142 including a first metal line 144 and a second metal line 145 may be formed on the reflection preventing layer 140 of the photo-sensing region. Also, a second insulating layer 141 including the first metal line 144, the second metal line 145, and a third metal line 146 may be formed on the reflection preventing layer 140 of the periphery region. A fourth metal line 147, which is electrically connected to an external portion, may be formed on the second insulating layer 141, and a protection layer 154 including a photo blocking layer pattern 152 to cut off the incident light is formed on the first insulating layer 142. A color filter 156, a planarization layer 158, and a micro lens 160 to focus the incident light toward the photodiode 150 are subsequently formed on the protection layer 154.

The first device isolating layer 120, the first spacer 136, the lowermost layer of the reflection preventing layer 140, or the first insulating layer 142 may operate to perform total reflection. More specifically, total reflection is attained by combining a layer with a relatively small refractivity with a layer with a relatively higher refractivity and a layer with a relatively small refractivity as a composite layer. For example, the lowermost layer of the first device isolating layer 120 includes a composite of a silicon oxide with a refractivity of about 1.5, the first spacer 136 composed of silicon nitride with a refractivity of about 2.0, and the reflection preventing layer 140 composed of silicon oxide with a refractivity of about 1.5. Moreover, the first device isolating layer 120, the first spacer 136, and the first insulating layer 142 may also allow for the total reflection.

Furthermore, the lowermost layer of the sidewall oxide layer 134, the second spacer 138, and the reflection preventing layer 140 or the first insulating layer 142 may satisfy the conditions of attaining total reflection. For example, the lowermost layer of the sidewall oxide layer 134 composed of silicon oxide with a refractivity of about 1.5, the second spacer 138 composed of silicon nitride with a refractivity of about 2.0, and the reflection preventing layer 140 composed of silicon oxide with a refractivity of about 1.5 satisfy the condition of total reflection. Additionally, the sidewall oxide layer 134, the second spacer 138, the first insulating layer 142 allow for total reflection.

FIGS. 13 through 17 are sectional views illustrating methods of manufacturing the image sensor according to additional embodiments of the present invention. Referring to FIG. 13, the mask nitride layer 104 is partially removed via wet etching using $H_3PO_4$. Thereafter, a third device isolating layer 220 obtained by slanting an upper end surface of the first device isolating layer 120 is formed via wet etching using diluted HF, $NH_4F$, or a Buffered Oxide Etchant (BOE) that is a mixture of HF and deionized water. By slanting an upper end surface of the third device isolating layer 220, the gate electrode material layer 130 on the third device isolating layer 220 may be easily removed in a subsequent process.

Referring to FIG. 14, the remaining mask nitride layer 104 is removed using a phosphoric solution, the pad oxide layer 102 is removed using diluted HF, $NH_4F$, or a Buffered Oxide Etchant (BOE) that is a mixture of HF and deionized water. By doing so, a portion of the semiconductor substrate 100 where the photodiode will be formed is exposed in the photo-sensing region, and another portion of the semiconductor substrate 100 where the transistor will be formed is exposed in the periphery region.

Referring to FIG. 15, the gate insulating layer 128 is formed on the semiconductor substrate 100 between the second and third device isolating layers 125 and 220. The gate insulating layer 128 may be any one selected from a thermal oxide layer or an insulating layer with a high dielectric constant (e.g., a CVD oxide layer or an ONO layer). Thereafter, the gate insulating layer 128, and the gate electrode material layer 130 covering the second and third device isolating layer 125 and 220 are formed. The gate electrode material layer 130 may be a single layer composed of a material selected from a group consisting of amorphous polysilicon, doped polysilicon, poly-SiGe, and a conductive metal or a composite layer of these. The conductive metal may be selected from a group consisting of a metal such as tungsten or molybdenum, and a conductive metal nitride such as titanium nitride, tantalum nitride or tungsten nitride, to form at least a single layer. Then, the gate electrode material layer 130 covering the gate insulating layer 128 and the second and third device isolating layers 125 and 220 is formed.

Referring to FIG. 16, a fourth photoresist pattern (not shown) to define gates is formed. Thereafter, using the fourth photoresist pattern as an etch mask, the gate electrode material layer 130 is removed via anisotropic dry etching to form the gates. The gate (e.g., the transfer gate 132) in the photo-sensing region and the MOS gate 133 in the peripheral region are formed. In some cases, the thin thermal oxide layer 134 may be formed along the sidewalls of the gates 132 and 133. During forming the gates, the sidewall of the first device isolating layer 120 may be partially removed.

Subsequently, the photodiode 150 is formed in the semiconductor substrate between the gate (e.g., the transfer gate 132) of the photo-sensing region and the third device isolating layer 220. The photodiode 150 generally includes the p-type photodiode region 151 and the n-type photodiode region 152. After forming a third spacer 236 along the sidewall of the third device isolating layer 220 contacting with the photodiode 150, the second spacer 138 is formed on the entire surface of the transfer gate 132 and the thermal oxide layer 134 along the sidewall of the MOS gate 133 in the peripheral region. In this case, the refractivities of the second and third spacers 138 and 236 are preferably greater than the refractivity of the third device isolating layer 220.

Figure 17:
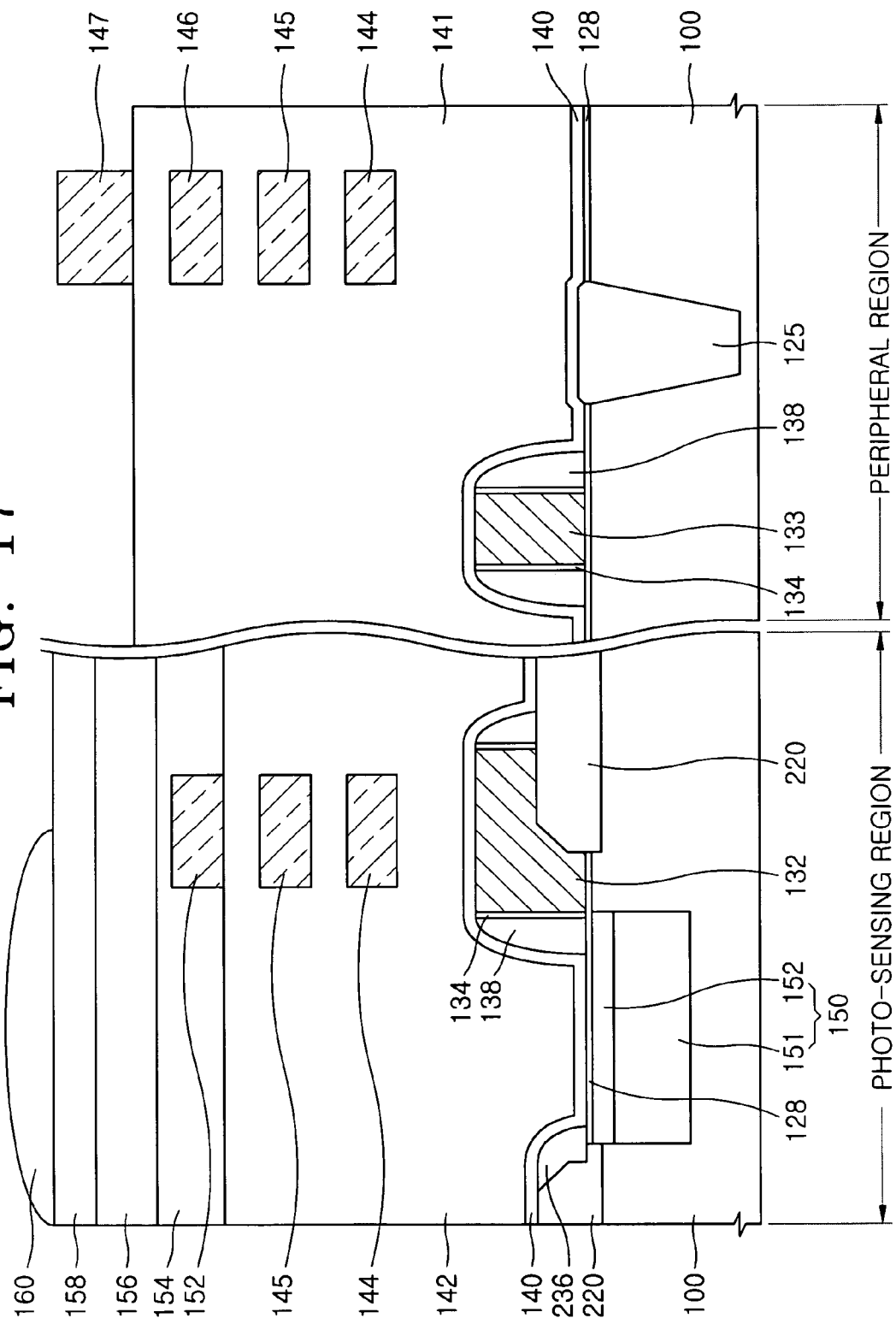

Referring to FIG. 17, the reflection preventing layer 140 is formed on the entire surface of the photo-sensing region formed with the gates and the periphery region. The reflection preventing layer 140 decreases the reflection of the incident light and thereby increase a quantity of receiving the light. A reflection preventing layer may be obtained by stacking an insulating layer with a small refractivity and an insulating with a great refractivity to thereby decrease the reflection rate. Therefore, as known to those skilled in the art the reflection preventing layer may be at least double-layered by combining insulating layers with refractivities different from each other.

Subsequently, the first insulating layer 142 including the first metal line 144 and the second metal line 145 may be formed on the reflection preventing layer 140 of the photo-sensing region. Also, the second insulating layer 141 including the first metal line 144, the second metal line 145, and the third metal line 146 may be formed on the reflection preventing layer 140 of the periphery region. A fourth metal line 147 electrically connected to an external portion may be formed on the second insulating layer 141, and the protection layer 154 including a photo blocking layer pattern 152 to block incident light is formed on the first insulating layer 142. The color filter 156, the planarization layer 158, and the micro lens 160 to focus the incident light toward the photodiode 150 are subsequently formed.

The lowermost layer of the third device isolating layer 220, the third spacer 236, the reflection preventing layer 140 or the first insulating layer 142 according to the present invention satisfy conditions to perform total reflection. For example, the lowermost layer of the third device isolating layer 220 composed of silicon oxide with a refractivity of about 1.5, the third spacer 236 composed of silicon nitride with a refractivity of about 2.0, and the reflection preventing layer 140 composed of silicon oxide with a refractivity of about 1.5 satisfies the conditions of total reflection. Moreover, the third device isolating layer 220, the third spacer 136, and the first insulating layer 142 also allow for total reflection.

In an image sensor and a method of manufacturing the same according to the present invention, a portion adjacent to a photodiode is insulated by a device isolating layer protruding from a semiconductor substrate to prevent dark current occurring due to a crystalline defect of an interfacial surface of the device isolating layer. Additionally, a spacer used to increase reflection with a first device isolating layer and a transfer gate is formed along a sidewall of the first device isolating layer and the transfer gate, thereby improving efficiency of light incident on the photodiode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor, comprising:
   a semiconductor substrate having a photodiode therein, said photodiode comprising a semiconductor region of first conductivity type extending to a first portion of a surface of said semiconductor substrate configured to receive light incident thereon;
   a first device isolating layer having a sidewall extending adjacent the first portion of the surface of said semiconductor substrate;
   a first electrically insulating spacer extending on the sidewall of said first device isolating layer, said first electrically insulating spacer comprising a material having a greater refractivity than said first device isolating layer; and
   an electrically insulating reflection inhibiting layer covering said first electrically insulating spacer and the first portion of the surface of said semiconductor substrate, said reflection inhibiting layer comprising a material having a lower refractivity than said first electrically insulating spacer.

2. The image sensor of claim 1, further comprising a charge transfer electrode extending adjacent the first portion of the surface of said semiconductor substrate.

3. The image sensor of claim 2, wherein said charge transfer electrode extends onto an upper surface of said first device isolating layer and has a sidewall extending adjacent the first portion of the surface of said semiconductor substrate.

4. The image sensor of claim 3, further comprising a second electrically insulating spacer extending on the sidewall of said charge transfer electrode.

5. The image sensor of claim 4, wherein said second electrically insulating spacer comprises a material having a greater refractivity that said first device isolating layer.

6. The image sensor of claim 5, wherein said first and second electrically insulating spacers comprise a nitride material.

7. The image sensor of claim 2, wherein said charge transfer electrode has a sidewall extending adjacent the first portion of the surface of said semiconductor substrate.

8. The image sensor of claim 7, further comprising a second electrically insulating spacer extending on the sidewall of said charge transfer electrode.

9. The image sensor of claim 8, wherein said second electrically insulating spacer comprises a material having a greater refractivity that said first device isolating layer.

10. The image sensor of claim 9, wherein said first and second electrically insulating spacers comprise a nitride material.

11. A method of forming an image sensor, comprising the steps of:
    forming a first device isolating layer having an opening therein that exposes a first portion of a surface of a semiconductor substrate;
    filling the opening with an electrically conductive layer;
    selectively etching the electrically conductive layer to define a transfer gate electrode within a portion of the opening; and
    forming a photodiode in the semiconductor substrate by implanting dopants into the first portion of the surface of the semiconductor substrate, using the transfer gate electrode as an implant mask;
    wherein said step of selectively etching the electrically conductive layer is followed by the steps of forming an electrically insulating spacer on a sidewall of the transfer gate electrode and forming an electrically insulating reflection inhibiting layer covering the electrically insulating spacer and the first portion of the surface of the semiconductor substrate.

12. The method of claim 11, wherein a refractivity of the electrically insulating spacer is greater than a refractivity of the first device isolating layer.

13. The method of claim 11, wherein the electrically insulating reflection inhibiting layer has a lower reflectivity relative to the electrically insulating spacer.

* * * * *